United States Patent
Yang et al.

(10) Patent No.: US 12,422,475 B2
(45) Date of Patent: Sep. 23, 2025

(54) ADJUSTABLE SUPPORTING DEVICE

(71) Applicant: HERMES TESTING SOLUTIONS INC., Hsinchu (TW)

(72) Inventors: Yi-Chun Yang, Hsinchu (TW); Sih-Ying Chang, Hsinchu (TW)

(73) Assignee: HERMES TESTING SOLUTIONS INC., Hsinchu (TW)

( * ) Notice: Subject to any disclaimer, the term of this patent is extended or adjusted under 35 U.S.C. 154(b) by 161 days.

(21) Appl. No.: 18/481,992

(22) Filed: Oct. 5, 2023

(65) Prior Publication Data

US 2025/0044347 A1 Feb. 6, 2025

(30) Foreign Application Priority Data

Aug. 4, 2023 (TW) .................................. 112129271

(51) Int. Cl.
  *G01R 31/28* (2006.01)
  *G01R 1/073* (2006.01)
(52) U.S. Cl.
  CPC ..... *G01R 31/2887* (2013.01); *G01R 1/07328* (2013.01); *G01R 1/07364* (2013.01)
(58) Field of Classification Search
  None
  See application file for complete search history.

(56) References Cited

U.S. PATENT DOCUMENTS

| | | | | |
|---|---|---|---|---|
| 4,912,399 A * | 3/1990 | Greub | .................. | G01R 1/0735 324/755.09 |
| 5,386,197 A * | 1/1995 | Saito | .................. | G01R 31/2808 324/750.19 |
| 5,461,326 A * | 10/1995 | Woith | .................. | G01R 1/0735 324/755.09 |
| 5,672,977 A * | 9/1997 | Yamada | ............... | G01R 1/0735 324/754.14 |
| 5,825,192 A * | 10/1998 | Hagihara | ........... | G01R 31/2887 324/762.01 |
| 5,847,571 A * | 12/1998 | Liu | ....................... | G01R 1/0735 324/755.09 |
| 6,759,258 B2 * | 7/2004 | Kasukabe | .......... | G01R 31/2889 438/18 |
| 6,798,224 B1 * | 9/2004 | Hembree | ........... | G01R 31/2886 324/754.2 |
| 7,956,627 B2 * | 6/2011 | Kasukabe | ................ | G01R 3/00 324/750.22 |

(Continued)

*Primary Examiner* — Richard Isla
(74) *Attorney, Agent, or Firm* — JCIPRNET

(57) ABSTRACT

An adjustable supporting device including a circuit board, a first fixing module, an adjusting module, a second fixing module, and a supporting base is configured to support a test circuit module. The supporting base is positioned in a first opening of the circuit board, a second opening of the first fixing module, and a third opening of the adjusting module and abuts against the second fixing module and a carrier of the test circuit module. The supporting base includes a first portion abutting against the second fixing module, a second portion connected to a third portion, the third portion connected to a fourth portion, and the fourth portion abutting against the carrier. The first portion and the second portion adjust the parallelism between the test circuit module and a semiconductor element through contact, thereby adjusting the horizontal flatness of multiple contact points of the test circuit module.

11 Claims, 5 Drawing Sheets

(56) References Cited

U.S. PATENT DOCUMENTS

| | | | | |
|---|---|---|---|---|
| 8,253,428 | B2* | 8/2012 | Komoto | G01R 1/07 |
| | | | | 324/762.01 |
| 10,712,383 | B2* | 7/2020 | Nagata | G01R 31/2886 |
| 2012/0313659 | A1* | 12/2012 | Hsu | G01R 1/07314 |
| | | | | 324/755.05 |

* cited by examiner

ADJUSTABLE SUPPORTING DEVICE

CROSS-REFERENCE TO RELATED APPLICATION

This application claims the priority benefit of Taiwan application serial no. 112129271, filed on Aug. 4, 2023. The entirety of the above-mentioned patent application is hereby incorporated by reference herein and made a part of this specification.

BACKGROUND

Technical Field

The disclosure relates to an adjustable supporting device, and particularly relates to an adjustable supporting device configured to support a test circuit module.

Description of Related Art

IC testing is an important part of the IC manufacturing process and generally may be divided into IC wafer test before dicing and packaging and IC final test after packaging and forming. The IC wafer test before dicing and packaging aims at testing the electrical function of the chip, so that the chip with poor electrical function can be filtered out before the IC entering the packaging, so as to reduce the defective rate cost of the finished IC, thereby reducing the consumption of manufacturing costs. The IC final test after packaging and forming aims to confirm whether attributes such as the function, speed, tolerance, power consumption, heat dissipation of the finished IC are normal, so as to ensure the quality of the IC before shipment.

In the wafer manufacturing process, using the corresponding external circuit to contact the corresponding contact point of the wafer to obtain certain data to verify the wafer process and IC quality is the related art of wafer testing. During the wafer testing process, how to allow the test circuit and the circuit to be tested to make effective and proper pressure contact is one of the important issues.

SUMMARY

The disclosure provides an adjustable supporting device, which can make effective contact between a test circuit module and a semiconductor element.

The adjustable supporting device according to the disclosure is configured to support a test circuit module. The test circuit module includes a carrier and a plurality of contact points disposed on the carrier. The contact point is configured to test the electrical properties of the semiconductor element. The adjustable supporting device includes a circuit board, a first fixing module, an adjusting module, a second fixing module, and a supporting base. The circuit board has a first opening. The first fixing module is disposed on the circuit board and has a second opening. The test circuit module is fixed on the circuit board through the first fixing module, the test circuit module is electrically connected to the circuit board, and the contact point faces the semiconductor element. The adjusting module is disposed on the first fixing module and has a third opening. The second fixing module is disposed on the adjusting module. The supporting base is positioned in the first opening, the second opening, and the third opening and abuts against the second fixing module and the carrier of the test circuit module. The supporting base includes a first portion, a second portion, a third portion, and a fourth portion. The first portion abuts against the second fixing module, the second portion is connected to the third portion, the third portion is connected to the fourth portion, and the fourth portion abuts against the carrier of the test circuit module. The first portion and the second portion adjust the parallelism between the test circuit module and the semiconductor element through contact, thereby adjusting the horizontal flatness of the contact point.

In an embodiment of the disclosure, the test circuit module includes a membrane probe or a probe card.

In an embodiment of the disclosure, one of the first portion and the second portion of the supporting base has a groove, and another of the first portion and the second portion of the supporting base has a protrusion. The curvature of the groove is different from the curvature of the protrusion. The first portion and the second portion adjust the parallelism between the test circuit module and the semiconductor element through the rotational contact between the protrusion and the groove.

In an embodiment of the disclosure, the supporting base further includes at least one ball disposed between the first portion and the second portion. The first portion and the second portion adjust the parallelism between the test circuit module and the semiconductor element through the rotational contact of the at least one ball.

In an embodiment of the disclosure, the first portion has a first groove, the second portion has a second groove, and the at least one ball is positioned between the first groove and the second groove.

In an embodiment of the disclosure, the adjustable supporting device further includes a material layer disposed between the fourth portion of the supporting base and the carrier of the test circuit module.

In an embodiment of the disclosure, the adjusting module includes a board body, at least one screw with element, and at least one elastic element. The board body has the third opening. The at least one screw with element is disposed on the board body and runs through the board body into the first fixing module, so as to adjust the board body and the first fixing module by screwing. The at least one elastic element is disposed between the board body and the first fixing module.

In an embodiment of the disclosure, the adjusting module adjusts the parallelism with the first fixing module through the at least one screw with element and the at least one elastic element, thereby assisting in adjusting the horizontal flatness of the contact point.

In an embodiment of the disclosure, the first fixing module includes a board body and the at least one screw with element. The board body has the second opening. The at least one screw with element is disposed on the board body and runs through the board body and the carrier of the test circuit module into the circuit board, so as to fix the board body, the test circuit module, and the circuit board by screwing.

In an embodiment of the disclosure, the second fixing module includes a board body, the at least one screw with element, and the at least one elastic element. The at least one screw with element is disposed on the board body and runs through the board body into the adjusting module, so as to fix the board body and the adjusting module by screwing. The at least one elastic element is disposed between the board body and the adjusting module.

In an embodiment of the disclosure, the supporting base further includes a plurality of pogo pins. The first portion has a plurality of through holes, and the second portion has a plurality of grooves corresponding to the through holes. The pogo pins respectively pass through the through holes and are connected into the grooves. The first portion and the second portion adjust the parallelism between the test circuit module and the semiconductor element through the compression contact of the pogo pins.

Based on the above, in the design of the adjustable supporting device according to the disclosure, the first portion and the second portion of the supporting base adjust the parallelism between the test circuit module and the semiconductor element through contact, thereby adjusting the horizontal flatness of the contact point of the test circuit module, in order to achieve the purpose of effective contact between the test circuit module and the semiconductor element.

In order to make the above-mentioned features and advantages of the disclosure more comprehensible, the embodiments are described in detail below with the accompanying drawings.

DESCRIPTION OF THE EMBODIMENTS

Figure 1A:
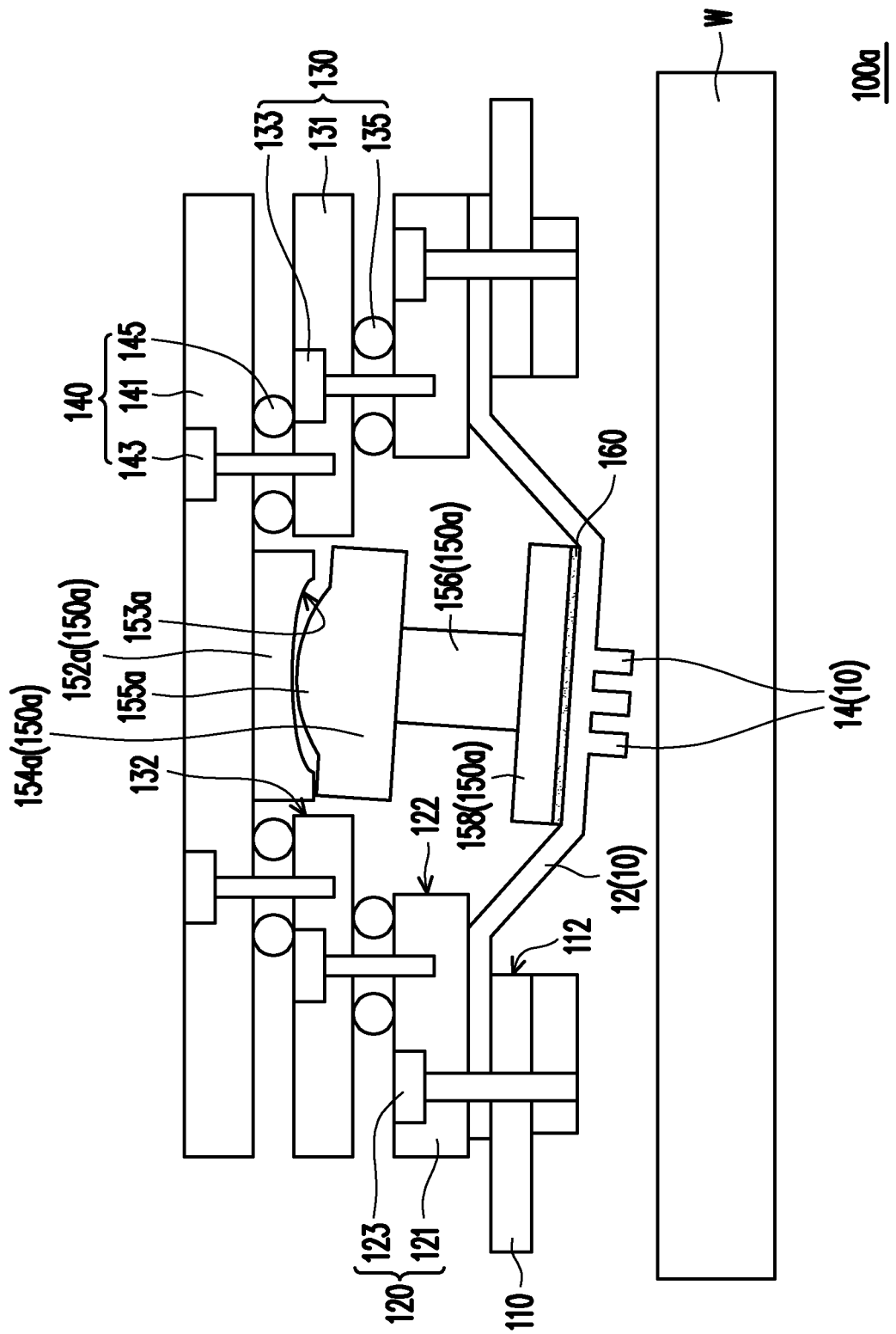
FIG. 1A and FIG. 1B are schematic views of an adjustable supporting device before and after adjustment according to an embodiment of the disclosure.

Each embodiment of the disclosure will be described in detail below and illustrated with accompanying drawings. In addition to these detailed descriptions, the disclosure can also be widely implemented in other embodiments, and any easy substitution, modification, and equivalent changes of the embodiments are included in the scope of the disclosure, and the scope of the appended claims shall prevail. In the description of the specification, many specific details are provided in order to enable readers to have a more complete understanding of the disclosure. However, the disclosure may still be practiced under the premise that a portion or all of the specific details are omitted. Also, well-known steps or elements have not been described in detail in order to avoid unnecessarily limiting the disclosure. The same or similar elements in the drawings will be represented by the same or similar reference numerals. Please note that the views are for illustrative purposes only, and do not represent the actual size or quantity of elements. Some details may not be fully drawn for the sake of brevity.

Figure 1B:
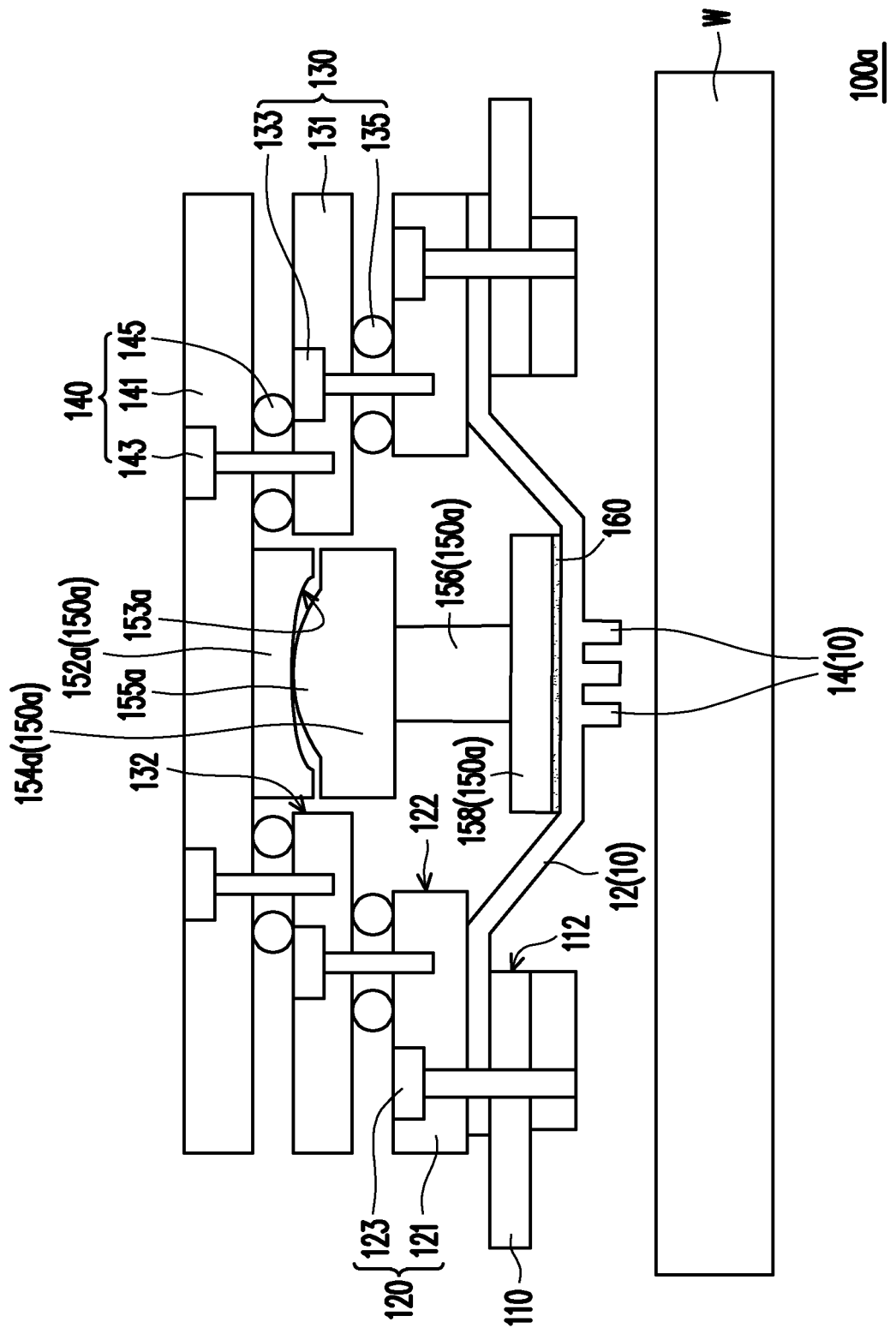

FIG. 1A and FIG. 1B are schematic views of an adjustable supporting device before and after adjustment according to an embodiment of the disclosure. Please refer to FIG. 1A and FIG. 1B at the same time. In this embodiment, an adjustable supporting device 100a is configured to support a test circuit module 10. The test circuit module 10 includes a carrier 12 and a plurality of contact points 14 disposed on the carrier 12, in which the contact point 14 is configured to test the electrical properties of a semiconductor element W. In an embodiment, the semiconductor element W is, for example, a wafer, a single die, or a semiconductor chip package, but not limited thereto. In an embodiment, the test circuit module 10 is, for example, a membrane probe or a probe card, but not limited thereto. In this embodiment, the test circuit module 10 is illustrated with a membrane probe structure.

Specifically, in this embodiment, the adjustable supporting device 100a includes a circuit board 110, a first fixing module 120, an adjusting module 130, a second fixing module 140, and a supporting base 150a. The circuit board 110 has a first opening 112. The first fixing module 120 is disposed on the circuit board 110 and has a second opening 122. The test circuit module 10 is fixed on the circuit board 110 through the first fixing module 120, the test circuit module 10 is electrically connected to the circuit board 110, and the contact point 14 of the test circuit module 10 faces the semiconductor element W. The adjusting module 130 is disposed on the first fixing module 120 and has a third opening 132. The second fixing module 140 is disposed on the adjusting module 130. The supporting base 150a is positioned in the first opening 112, the second opening 122, and the third opening 132 and abuts against the second fixing module 140 and the carrier 12 of the test circuit module 10 directly or indirectly. The supporting base 150a includes a first portion 152a, a second portion 154a, a third portion 156, and a fourth portion 158. The first portion 152a abuts against the second fixing module 140, the second portion 154a is connected to the third portion 156, the third portion 156 is connected to the fourth portion 158, and the fourth portion 158 abuts against the carrier 12 of the test circuit module 10. The first portion 152a and the second portion 154a adjust the parallelism between the test circuit module 10 and the semiconductor element W through contact, thereby adjusting the horizontal flatness of the contact point 14 of the test circuit module 10.

Furthermore, in this embodiment, the first fixing module 120 includes a board body 121 and at least one screw with element (two screw with elements 123 are schematically shown). The board body 121 has the second opening 122, in which the second opening 122 is connected to the first opening 112, and the diameter of the second opening 122 may be smaller than the diameter of the first opening 112, but not limited thereto. The screw with element 123 is disposed on the board body 121 and runs through the board body 121 and the carrier 12 of the test circuit module 10 into the circuit board 110, so as to fix the board body 121, the test circuit module 10, and the circuit board 110 by screwing.

Furthermore, the adjusting module 130 according to this embodiment includes a board body 131, at least one screw with element 133, and at least one elastic element 135. The board body 131 has the third opening 132, in which the third opening 132 is connected to the second opening 122 and the first opening 112, and the diameter of the third opening 132 may be smaller than the diameter of the second opening 122, but not limited thereto. The screw with element 133 is disposed on the board body 131 and runs through the board body 131 into the first fixing module 120, so as to adjust the board body 131 and the first fixing module 120 by screwing. The elastic element 135 is disposed between the board body 131 and the first fixing module 120. The adjusting module 130 adjusts the parallelism with the first fixing module 120 through the screw with element 133 and the elastic element 135, thereby assisting in adjusting the horizontal flatness of the contact point 14 of the test circuit module 10. In an embodiment, there are at least three or more groups of the screw with element 133 and the elastic element 135. In an embodiment, the elastic element 135 is, for example, an elastic gasket, such as an O-ring, but not limited thereto.

Furthermore, the second fixing module 140 according to this embodiment includes a board body 141, at least one screw with element 143, and at least one elastic element 145. The screw with element 143 is disposed on the board body 141 and runs through the board body 141 into the adjusting module 130, so as to fix the board body 141 and the adjusting module 130 by screwing. The elastic element 145 is disposed between the board body 141 and the adjusting module 130. In an embodiment, there are at least three or more groups of the screw with element 143 and the elastic element 145. In an embodiment, the positions of the screw with element 133 and the screw with element 143 may be disposed in a derangement manner, such as staggered at intervals, but not limited thereto. In an embodiment, the elastic element 145 is, for example, an elastic gasket, but not limited thereto. In an embodiment, the elastic element 135 and the elastic element 145 may be made of the same material or different materials, and not limited thereto.

Please again refer to FIG. 1A and FIG. 1B at the same time. In this embodiment, the first portion 152a of the supporting base 150a abuts against the board body 141 of the second fixing module 140 directly or indirectly. One of the first portion 152a and the second portion 154a of the supporting base 150a has a groove 153a, and another of the first portion 152a and the second portion 154a of the supporting base 150a has a protrusion 155a. Preferably, the curvature of the groove 153a is different from the curvature of the protrusion 155a. In this embodiment, the first portion 152a of the supporting base 150a has the groove 153a, and the second portion 154a has the protrusion 155a. The first portion 152a and the second portion 154a link the third portion 156, the fourth portion 158, and the carrier 12 of the test circuit module 10 through the rotational contact (such as a point contact) between the protrusion 155a and the groove 153a, so as to adjust the parallelism between the test circuit module 10 and the semiconductor element W, thereby adjusting the horizontal flatness of the contact point 14 of the test circuit module 10.

Furthermore, the level adjustment is made through the lens of the machine, and the adjustment is made by human judgment, and the machine calculates the adjusted level value. Specifically, if the measured level is from 0 μm to 2 μm, then this level is still different from the level of the semiconductor element W. In this embodiment, when the contact point 14 of the test circuit module 10 is not in contact with the semiconductor element W, that is, in a non-contact state, the first portion 152a and the second portion 154a of the supporting base 150a are in a free state; when the contact point 14 of the test circuit module 10 is in contact with the semiconductor element W, the first portion 152a and the second portion 154a rotate and contact to adjust the parallelism between the test circuit module 10 and the semiconductor element W, thereby adjusting the horizontal flatness of the contact point 14 of the test circuit module 10.

In addition, in an embodiment, the adjustable supporting device 100a may further include a material layer 160 disposed between the fourth portion 158 of the supporting base 150a and the carrier 12 of the test circuit module 10, so as to enable the contact point 14 of the test circuit module 10 to obtain different reaction forces. When the carrier 12 is a substrate that does not have conductive properties, the contact point 14 of the test circuit module 10 can obtain different reaction forces through the adhesive bonding method. At this time, the material layer 160 may be, for example, ultraviolet glue or silicone, but not limited thereto. In another not-shown embodiment, when the carrier 12 is a substrate having circuit wiring, the contact point 14 of the test circuit module 10 can obtain different reaction forces through the integral forming method. At this time, the material layer may be a dielectric layer in the process of the circuit wiring substrate, and the material of this dielectric layer may be a thermosetting material, such as PI, BCB, or other suitable thermosetting materials.

It has to be noted here that the following embodiment follows the reference numerals and part of content of the aforementioned embodiment, in which the same reference numerals are used to indicate the same or similar elements, and the description of the same technical content is omitted. For the description of omitting part, reference may be made to the aforementioned embodiment, and will not be repeated in the following embodiment.

Figure 2:
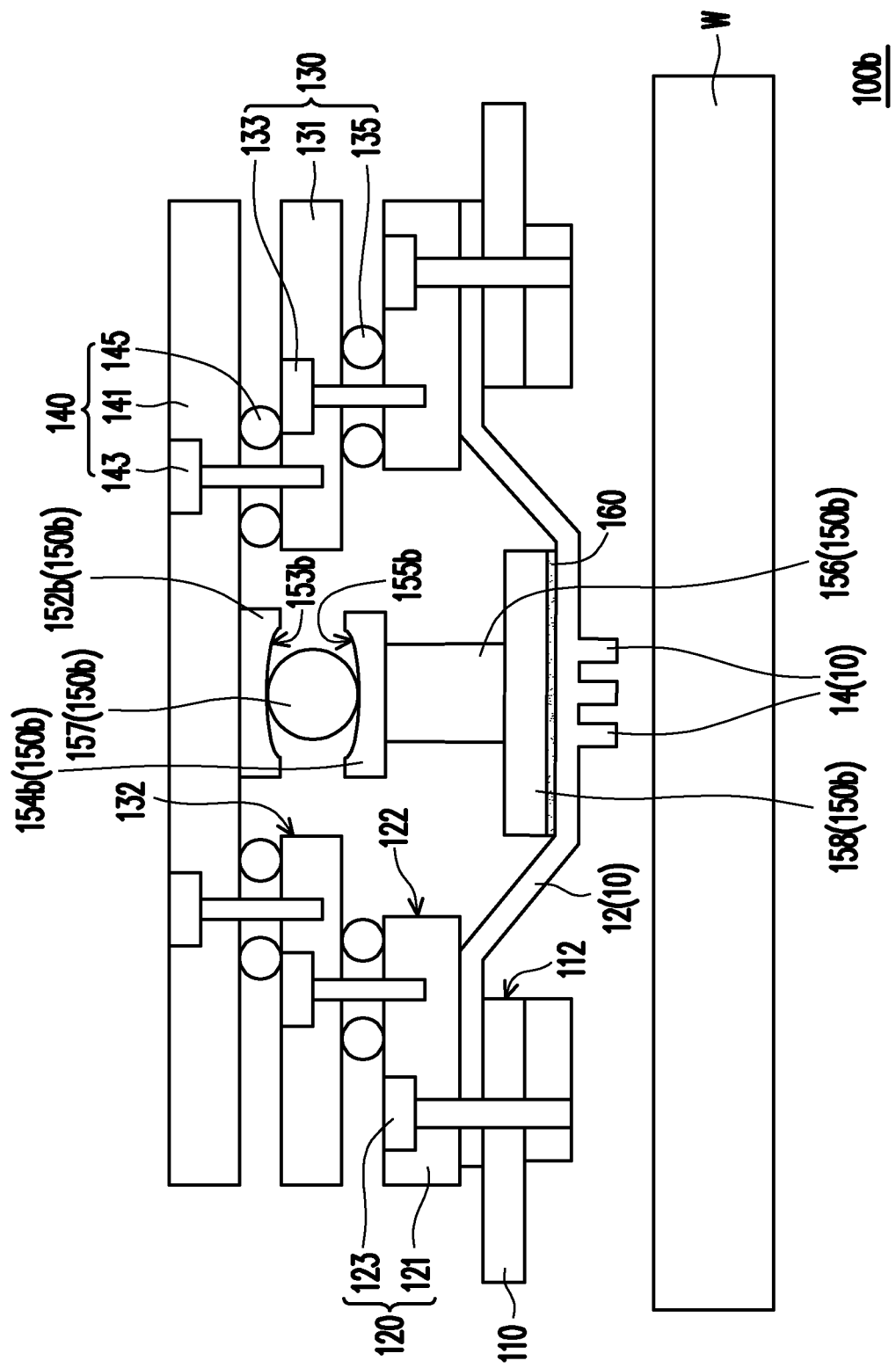
FIG. 2 is a schematic view of an adjustable supporting device according to another embodiment of the disclosure.

FIG. 2 is a schematic view of an adjustable supporting device according to another embodiment of the disclosure. Please refer to FIG. 1B and FIG. 2 at the same time. An adjustable supporting device 100b of this embodiment is similar to the adjustable supporting device 100a, and the difference between the two is that, in this embodiment, the structural design of a supporting base 150b is different from the structural design of the supporting base 150a.

Specifically, in this embodiment, the supporting base 150b further includes at least one ball (a ball 157 is schematically shown) disposed between a first portion 152b and a second portion 154b. The first portion 152b of the supporting base 150b has a first groove 153b, and the second portion 154b of the supporting base 150b has a second groove 155b, in which the ball 157 is positioned between the first groove 153b and the second groove 155b. The first portion 152b and the second portion 154b adjust the parallelism between the test circuit module 10 and the semiconductor element W through the rotational contact of the ball 157, thereby adjusting the horizontal flatness of the contact point 14 of the test circuit module 10.

Figure 3A:
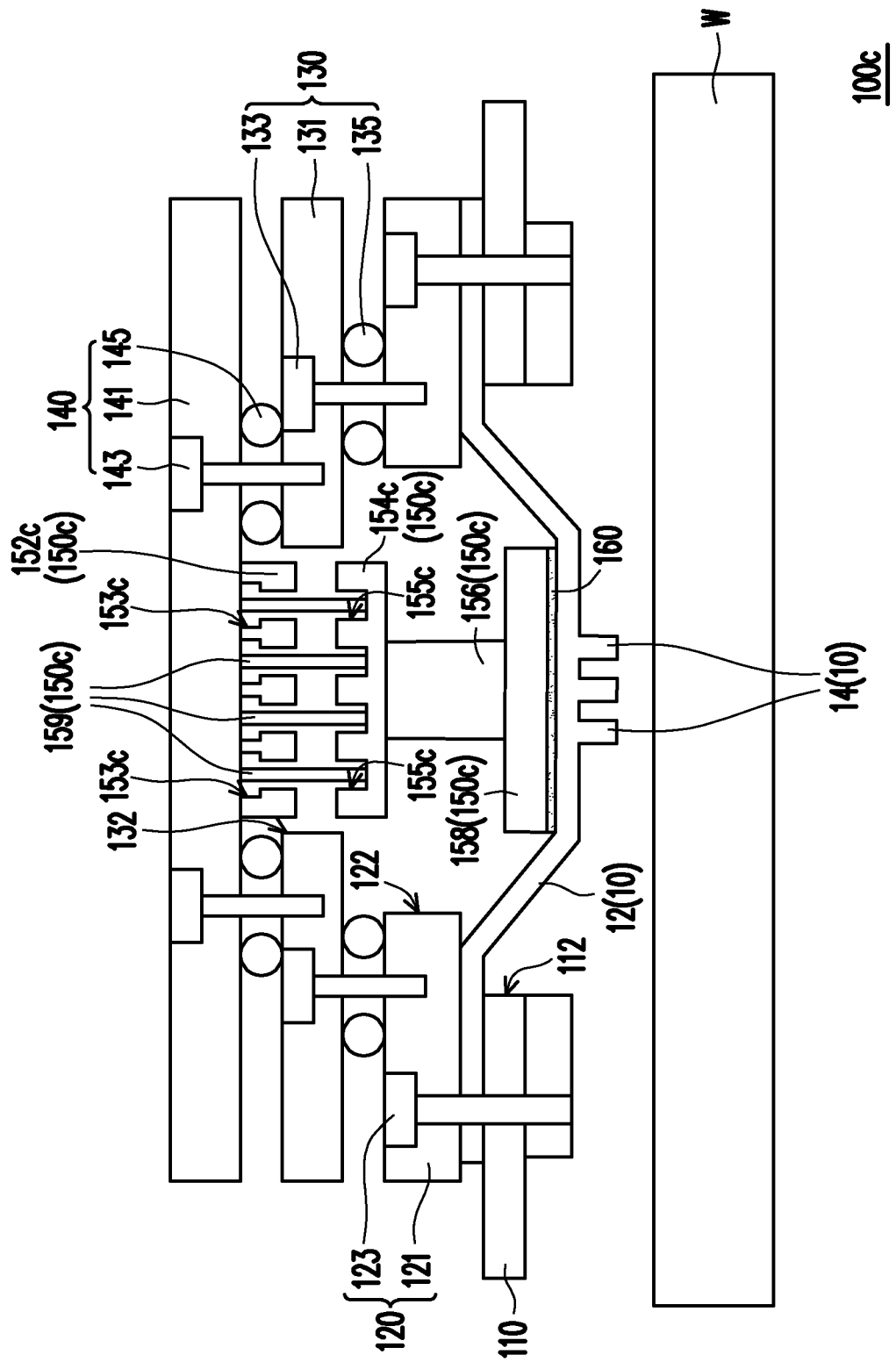
FIG. 3A is a schematic view of an adjustable supporting device according to another embodiment of the disclosure.
Figure 3B:
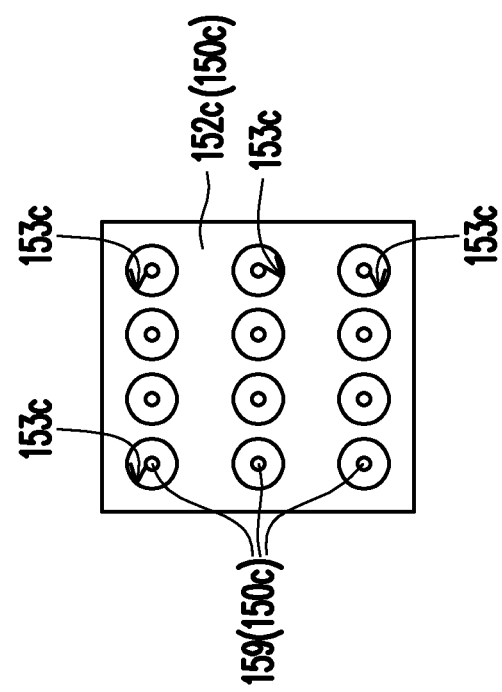
FIG. 3B is a schematic top view of a supporting base in FIG. 3A.

FIG. 3A is a schematic view of an adjustable supporting device according to another embodiment of the disclosure. FIG. 3B is a schematic top view of the supporting base in FIG. 3A. Please refer to FIG. 1B and FIG. 3A at the same time. An adjustable supporting device 100c of this embodiment is similar to the adjustable supporting device 100a, the difference between the two is that, in this embodiment, the structural design of a supporting base 150c is different from the structural design of the supporting base 150a.

In detail, please refer to FIG. 3A and FIG. 3B at the same time. In this embodiment, the supporting base 150c further includes a plurality of pogo pins 159, a first portion 152c of the supporting base 150c has a plurality of through holes 153c, and a second portion 154c of the supporting base 150c has a plurality of grooves 155c corresponding to the through holes 153c. The pogo pins 159 respectively pass through the through holes 153c and are connected into the grooves 155c, in which the pogo pins 159 are, for example, arranged in an array, and each pogo pin 159 directly abuts the board body 141 of the second fixing module 140 and the groove 155c and does not contact the first portion 152c of the supporting base 150c.

When the contact point 14 of the test circuit module 10 is not in contact with the semiconductor element W, that is, in the non-contact state, each pogo pin 159 of the supporting base 150c may be in the free state, that is, and may have different compression amounts respectively. When the contact point 14 of the test circuit module 10 is in contact with the semiconductor element W, the first portion 152c and the second portion 154c adjust the parallelism between the test circuit module 10 and the semiconductor element 14 through the compression contact of the pogo pins 159.

In summary, in the design of the adjustable supporting device according to the disclosure, the first portion and the second portion of the supporting base adjust the parallelism between the test circuit module and the semiconductor element through contact, thereby adjusting the horizontal flatness of the contact point of the test circuit module, in order to achieve the purpose of effective contact between the test circuit module and the semiconductor element.

Although the disclosure has been disclosed above with the embodiments, the embodiments are not intended to limit the disclosure. Persons with ordinary knowledge in the technical field may make some changes and modifications without departing from the spirit and scope of the disclosure. The scope of protection of the disclosure should be defined by the scope of the appended claims.

What is claimed is:

1. An adjustable supporting device configured to support a test circuit module, wherein the test circuit module comprises a carrier and a plurality of contact points disposed on the carrier, and the contact points are configured to test an electrical property of a semiconductor element, and the adjustable supporting device comprises:
   a circuit board having a first opening;
   a first fixing module disposed on the circuit board and having a second opening, wherein the test circuit module is fixed on the circuit board through the first fixing module, the test circuit module is electrically connected to the circuit board, and the contact points face the semiconductor element;
   an adjusting module disposed on the first fixing module and having a third opening;
   a second fixing module disposed on the adjusting module; and
   a supporting base positioned in the first opening, the second opening, and the third opening and abutting against the second fixing module and the carrier of the test circuit module, the supporting base comprises a first portion, a second portion, a third portion, and a fourth portion, the first portion abuts against the second fixing module, the second portion is connected to the third portion, the third portion is connected to the fourth portion, the fourth portion abuts against the carrier of the test circuit module, and the first portion and the second portion adjust a parallelism between the test circuit module and the semiconductor element through contact, thereby adjusting a horizontal flatness of the contact points.

2. The adjustable supporting device as claimed in claim 1, wherein the test circuit module comprises a membrane probe or a probe card.

3. The adjustable supporting device as claimed in claim 1, wherein one of the first portion and the second portion of the supporting base has a groove, the other of the first portion and the second portion of the supporting base has a protrusion, a curvature of the groove is different from a curvature of the protrusion, and the first portion and the second portion adjust the parallelism between the test circuit module and the semiconductor element through rotational contact between the protrusion and the groove.

4. The adjustable supporting device as claimed in claim 1, wherein the supporting base further comprises at least one ball disposed between the first portion and the second portion, and the first portion and the second portion adjust the parallelism between the test circuit module and the semiconductor element through rotational contact of the at least one ball.

5. The adjustable supporting device as claimed in claim 4, wherein the first portion has a first groove, the second portion has a second groove, and the at least one ball is positioned between the first groove and the second groove.

6. The adjustable supporting device as claimed in claim 1, further comprising:
   a material layer disposed between the fourth portion of the supporting base and the carrier of the test circuit module.

7. The adjustable supporting device as claimed in claim 1, wherein the adjusting module comprises:
   a board body having the third opening;
   at least one screw with element disposed on the board body and running through the board body into the first fixing module, so as to adjust the board body and the first fixing module by screwing; and
   at least one elastic element disposed between the board body and the first fixing module.

8. The adjustable supporting device as claimed in claim 7, wherein the adjusting module adjusts the parallelism with the first fixing module through the at least one screw with element and the at least one elastic element, thereby assisting in adjusting the horizontal flatness of the contact points.

9. The adjustable supporting device as claimed in claim 1, wherein the first fixing module comprises:
   a board body having the second opening; and
   at least one screw with element disposed on the board body and running through the board body and the carrier of the test circuit module into the circuit board, so as to fix the board body, the test circuit module, and the circuit board by screwing.

10. The adjustable supporting device as claimed in claim 1, wherein the second fixing module comprises:
    a board body;
    at least one screw with element disposed on the board body and running through the board body into the adjusting module, so as to fix the board body and the adjusting module by screwing; and
    at least one elastic element disposed between the board body and the adjusting module.

11. The adjustable supporting device as claimed in claim 1, wherein the supporting base further comprises a plurality of pogo pins, the first portion has a plurality of through holes, the second portion has a plurality of grooves corresponding to the through holes, the pogo pins respectively pass through the through holes and are connected into the grooves, and the first portion and the second portion adjust the parallelism between the test circuit module and the semiconductor element through compression contact of the pogo pins.

* * * * *